(12) United States Patent
Rao et al.

(10) Patent No.: US 8,681,499 B2
(45) Date of Patent: Mar. 25, 2014

(54) FASTENER AND ELECTRONIC ASSEMBLY HAVING THE SAME

(75) Inventors: Jia Rao, Jiangsu (CN); Zhi-Hui Zhao, Jinagsu (CN)

(73) Assignees: Furui Precise Component (Kunshan) Co., Ltd., Kunshan (CN); Foxconn Technology Co., Ltd., New Taipei (TW)

( * ) Notice: Subject to any disclaimer, the term of this patent is extended or adjusted under 35 U.S.C. 154(b) by 208 days.

(21) Appl. No.: 13/236,599

(22) Filed: Sep. 19, 2011

(65) Prior Publication Data

US 2012/0247815 A1 Oct. 4, 2012

(30) Foreign Application Priority Data

Mar. 28, 2011 (CA) .......................... 2011 1 0074654

(51) Int. Cl.
*H05K 7/20* (2006.01)
*H01L 23/40* (2006.01)

(52) U.S. Cl.
CPC .................. *H01L 23/4006* (2013.01)
USPC ......................................... 361/704; 361/719

(58) Field of Classification Search
CPC ................................................. H01L 23/4006
USPC ............ 361/704, 709, 719; 165/80.3, 104.33, 165/185; 439/75, 487, 801; 257/726, 727
See application file for complete search history.

(56) References Cited

U.S. PATENT DOCUMENTS

| | | | | |
|---|---|---|---|---|
| 3,152,855 A | * | 10/1964 | Crowther | 439/782 |
| 4,643,513 A | * | 2/1987 | Martin | 439/788 |
| 5,271,286 A | * | 12/1993 | Vranish | 74/490.03 |
| 6,545,879 B1 | * | 4/2003 | Goodwin | 361/807 |
| 6,956,392 B2 | * | 10/2005 | Wright | 324/750.05 |
| 7,428,154 B2 | * | 9/2008 | Ishimine et al. | 361/704 |
| 8,089,768 B2 | * | 1/2012 | Mauder et al. | 361/709 |

* cited by examiner

*Primary Examiner* — Yuriy Semenenko
(74) *Attorney, Agent, or Firm* — Novak Druce Connolly Bove + Quigg LLP

(57) ABSTRACT

An exemplary fastener includes a connecting member and a protecting member. The connecting member includes a head, and a connecting portion extending down away from the head. The protecting member includes a first engaging portion and a second engaging portion extending from the first engaging portion. The first and second engaging portions are coaxial. The connecting portion of the connecting member extends through the second engaging portion, the head of the connecting member is surrounded by the first engaging portion of the protecting member with a bottom surface of the head abutting a top end of the second engaging portion. A top end of the first engaging portion is above a top surface of the head and defines a receiving space above the head. The receiving space is adapted for receiving a tool therein.

20 Claims, 5 Drawing Sheets

FASTENER AND ELECTRONIC ASSEMBLY HAVING THE SAME

BACKGROUND

1. Technical Field

The present disclosure relates to fasteners, and particularly to a fastener used in an electronic assembly.

2. Description of Related Art

In many apparatuses such as computers, a heat sink is positioned in thermal contact with an electronic device inside the apparatus. The heat sink transfers heat generated by the electronic device away from the electronic device, such that overheating of the electronic device can be avoided. In general, the heat sink is mounted on a printed circuit board (PCB) inside the apparatus by screws. When the heat sink is assembled onto the PCB, the screws are rotated and driven toward the PCB by one or more tools. However, in practice, the tools are prone to detach from the screws during the assembly process. When this happens, other elements of the PCB may be damaged by the tools.

What is needed, therefore, is a means which can overcome the described limitations.

BRIEF SUMMARY OF THE INVENTION

According to one aspect of the present invention, a fastener comprises a connecting member and a helical spring that can be compressed along an axis thereof. The connecting member comprises a head and a connecting portion extending down away from the head. The spring comprises a first engaging portion and a second engaging portion extending from the first engaging portion. The first and second engaging portions are coaxial. The connecting portion of the connecting member extends through the second engaging portion. The head of the connecting member is surrounded by the first engaging portion of the spring with a bottom surface of the head abutting a top end of the second engaging portion. A top end of the first engaging portion is above a top surface of the head and defines a receiving space above the head, and the receiving space is adapted for receiving a tool therein.

According to another aspect of the present invention, An electronic assembly comprises a printed circuit board (PCB), a heat-generating element mounted on the PCB, a heat-absorbing base thermally contacting the heat-generating element, and a fastener. The fastener extends through the heat-absorbing base and engages with the PCB to mount the heat-absorbing base on the PCB. The fastener comprises a connecting member and a helical spring that can be compressed along an axis thereof. The connecting member comprises a head and a connecting portion extending down away from the head. The spring comprises a first engaging portion and a second engaging portion extending from the first engaging portion. The first and second engaging portions are coaxial. The connecting portion of the connecting member extends through the second engaging portion of the spring and the heat-absorbing base and is engaged with the PCB. The head of the connecting member is surrounded by the first engaging portion of the spring with a bottom surface of the head abutting a top end of the second engaging portion. A top end of the first engaging portion is above a top surface of the head and defines a receiving space above the head, and the receiving space is adapted for receiving a tool therein.

The foregoing has outlined rather broadly the features and technical advantages of the present invention in order that the detailed description of the invention that follows may be better understood. Additional features and advantages of the invention will be described hereinafter which form the subject of the claims of the invention.

DETAILED DESCRIPTION

Figure 1:
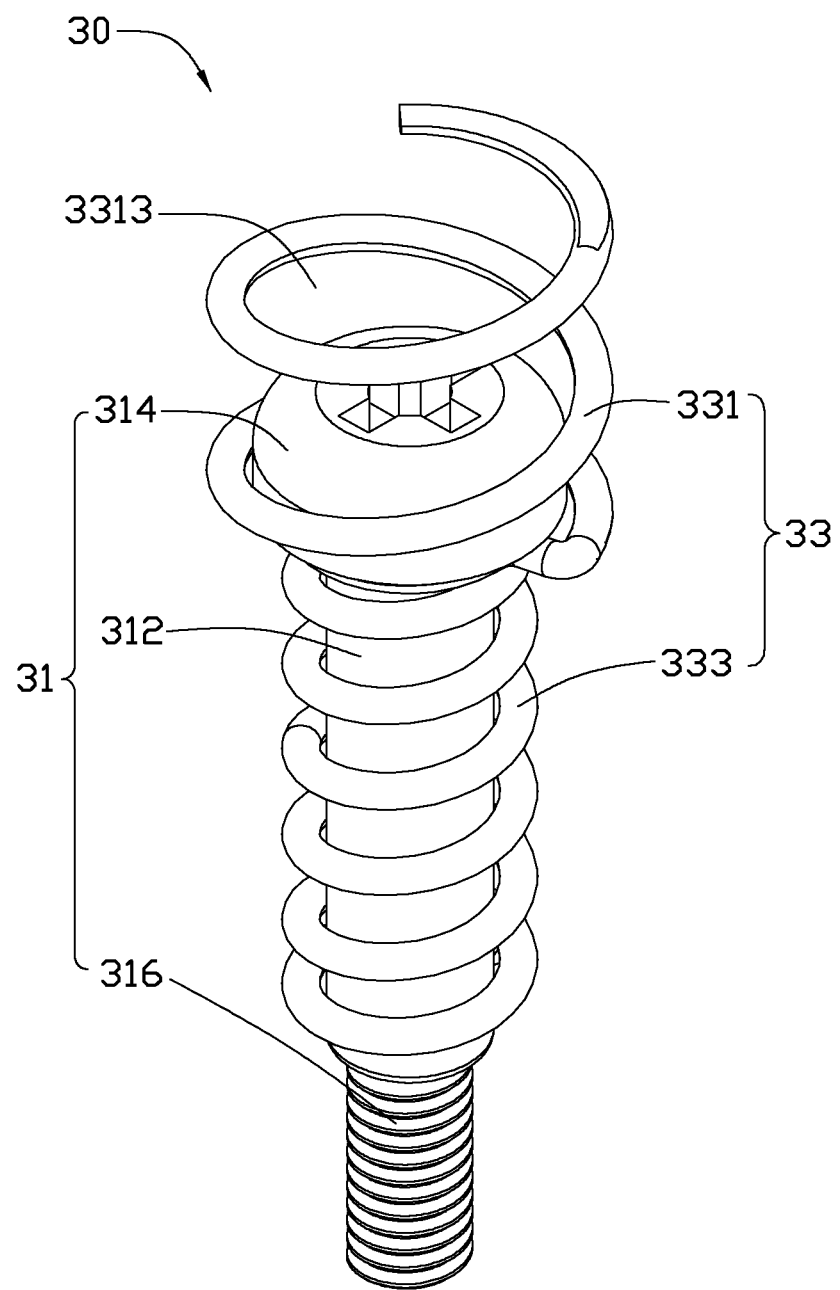
FIG. 1 is an assembled view of a fastener according to a first embodiment of the present disclosure.
Figure 2:
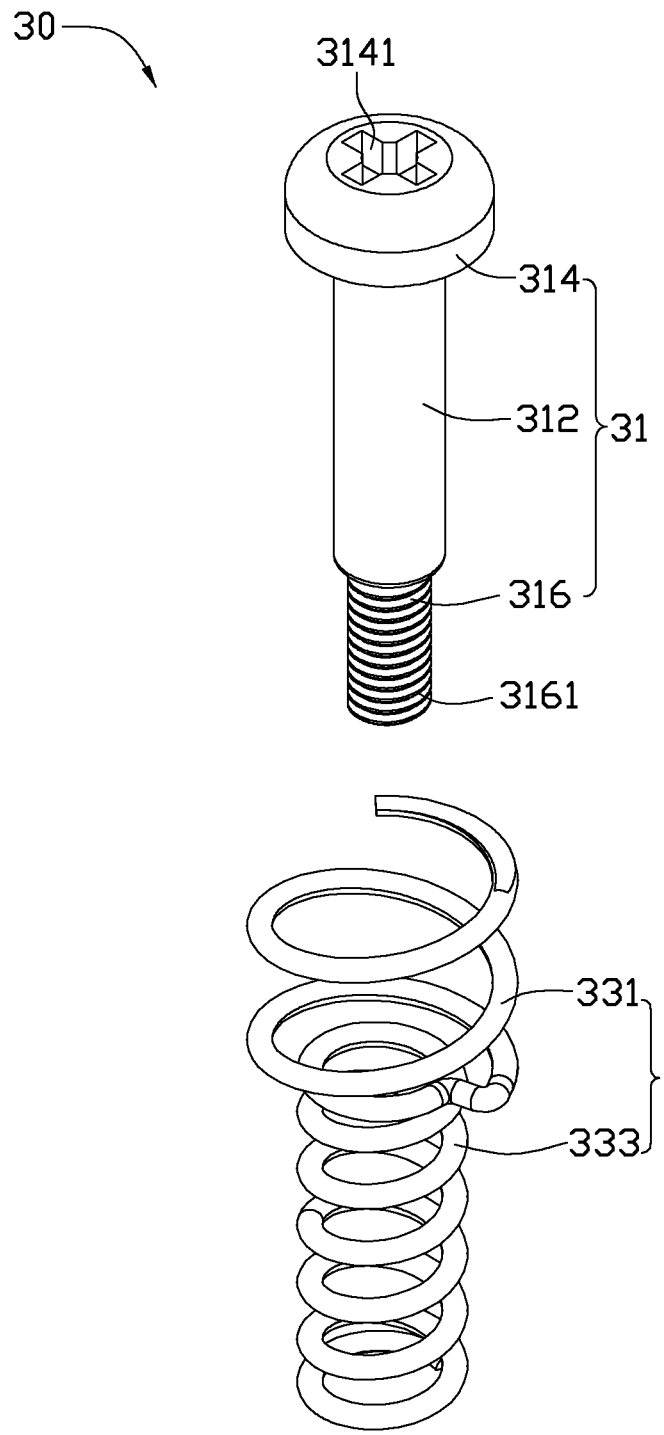
FIG. 2 is an exploded view of the fastener of FIG. 1.

Referring to FIGS. 1-2, a fastener 30 of a first embodiment is shown. The fastener 30 includes a connecting member 31 and a protecting member 33 surrounding the connecting member 31. In this embodiment, the connecting member 31 is a bolt and the protecting member 33 is a substantially helical spring. The protecting member 33 can be compressed along a longitudinal axis thereof.

The connecting member 31 is an integrally formed piece, and includes a cylindrical shaft 312, a disk-shaped head 314 and a connecting portion 316. The shaft 312 extends from a center of a bottom surface of the head 314. The connecting portion 316 is a cylinder, and is formed at a bottom of the shaft 312. A screw thread 3161 is formed on a periphery of the connecting portion 316. A diameter of the shaft 312 is smaller than that of the head 314, and larger than that of the connecting portion 316. The shaft 312, the head 314 and the connecting portion 316 are coaxial. A cross-shaped recess 3141 is defined in a central portion of a top surface of the head 314, for receiving a tool (not shown) therein, for example, a screwdriver, to manipulate the connecting member 31.

The protecting member 33 includes a helical first engaging portion 331 and a helical second engaging portion 333 extending from an end of the first engaging portion 331. The first engaging portion 331 and the second engaging portion 333 are coaxial. A spiraling direction of the first engaging portion 331 is similar to that of the second engaging portion 333. In the illustrated embodiment, the common spiraling direction can be described as counterclockwise and up. The number of coils (turns) of the first engaging portion 331 is much less than that of coils (turns) of the second engaging portion 333. An inner diameter of each of the coils of the first engaging portion 331 is larger than that of each of the coils of the second engaging portion 333. The inner diameter of each of the coils of the first engaging portion 331 is larger than the diameter of the head 314 of the connecting member 31. The inner diameter of each of the coils of the second engaging portion 333 is larger than the diameter of the shaft 312, and less than the diameter of the head 314 of the connecting member 31. A height of the first engaging portion 331 is less than that of the second engaging portion 333 as measured along the longitudinal axis of the protecting member 33, and larger than a thickness of the head 314 of the connecting member 31.

Referring to FIG. 1 again, in assembly, the shaft 312 of the connecting member 31 extends through the first engaging portion 331 and the second engaging portion 333 of the protecting member 33 in that sequence until the bottom surface of the head 314 of the connecting member 31 abuts against a top end of the second engaging portion 333. In this state, the shaft 312 is surrounded by the second engaging portion 333, and the head 314 is surrounded by the first engaging portion 331. The connecting portion 316 is located at an outside of (i.e., below) the second engaging portion 333. A top end of the first engaging portion 331 is located outside of (i.e. above) the head 314, and defines a receiving space 3313 above the recess 3141 to receive the tool therein.

Figure 3:
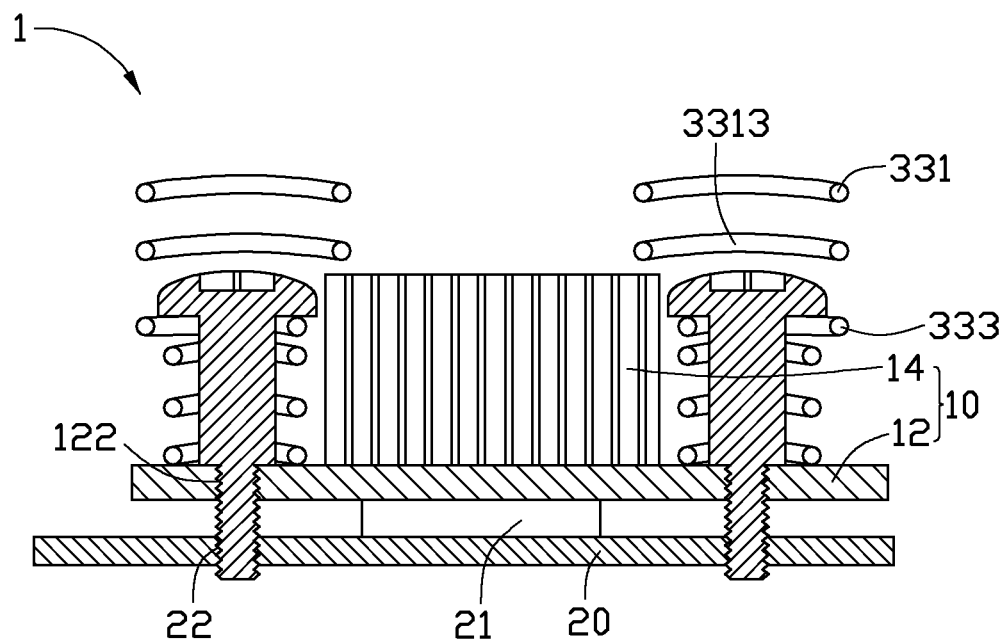
FIG. 3 is a cross sectional view of an electronic device including the fastener of FIG. 1.

Referring also to FIG. 3, an electronic assembly 1 is shown. The electronic assembly 1 includes a printed circuit board (PCB) 20, a heat-generating element 21 mounted on the PCB 20, and a heat sink 10 mounted on the heat-generating element 21. A plurality of screw holes 22 is defined in the PCB 20 around the heat-generating element 21. The heat sink 10 includes a heat-absorbing base 12, and a plurality of fins 14 extending up from the heat-absorbing base 12. A plurality of screw holes 122 is defined in the heat-absorbing base 12, corresponding to the screw holes 22 of the PCB 20.

When the electronic assembly 1 is assembled, first, each fastener 30 is assembled. Then the heat sink 10 is arranged on the PCB 20 and thermally contacts the heat-generating element 21. The assembled fasteners 30 are aligned with the screw holes 122 of the heat-absorbing base 12 and the screw holes 22 of the PCB 20. Tools, such as screwdrivers, can be elastically received in the receiving spaces 3313 of the protecting members 33 and inserted in the recesses 3141 of the connecting members 31 of the fasteners 30, to drive the fasteners 30 to screw down until the connecting portions 316 threadedly engage with threads of the screw holes 122, 22. That is, the top end of the first engaging portion 331 of each fastener 30 resiliently expands slightly when the corresponding tool is received in the receiving space 3313. Because the receiving space 3313 elastically receives the tool therein, the tool engages with the connecting member 31 stably and avoids becoming accidentally detached from the connecting member 31.

Figure 4:
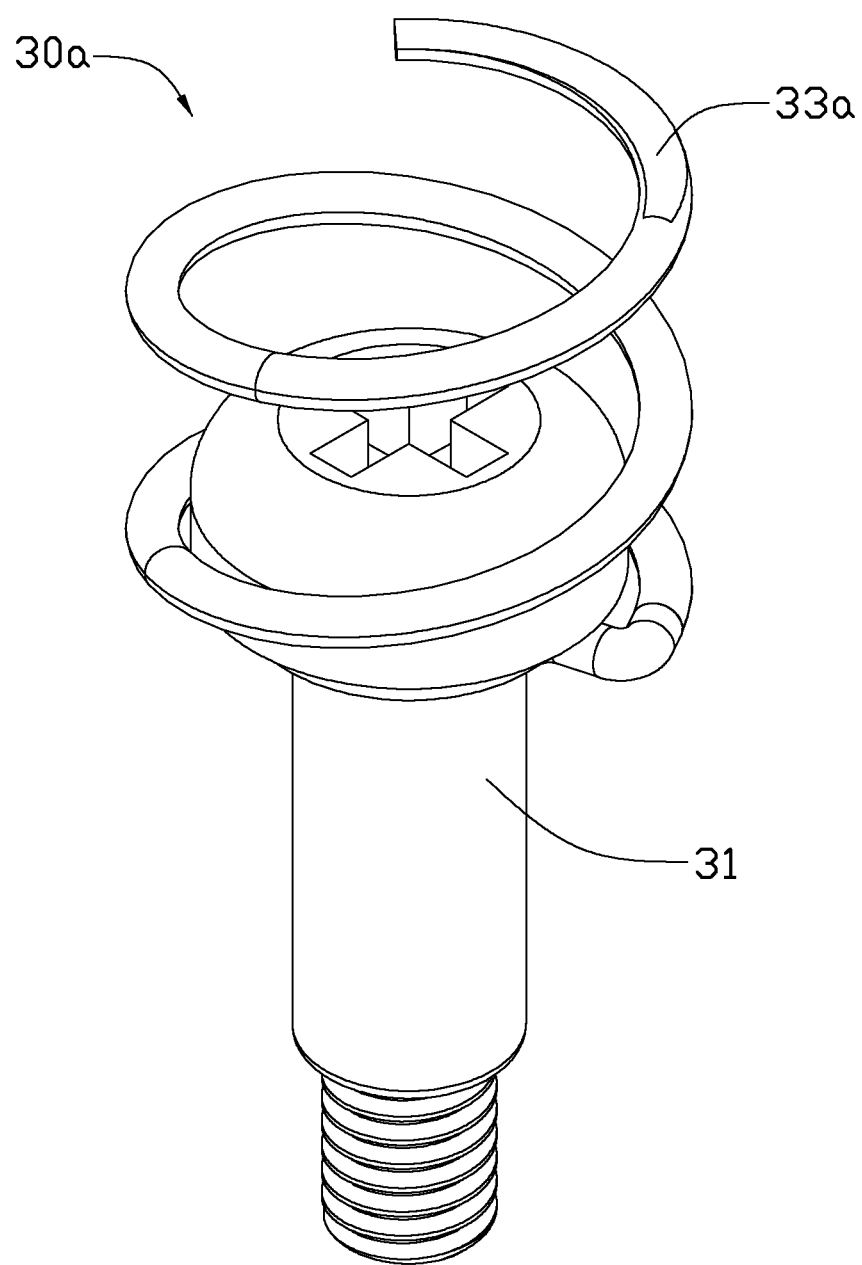
FIG. 4 is an assembled view of a fastener according to a second embodiment of the present disclosure.
Figure 5:
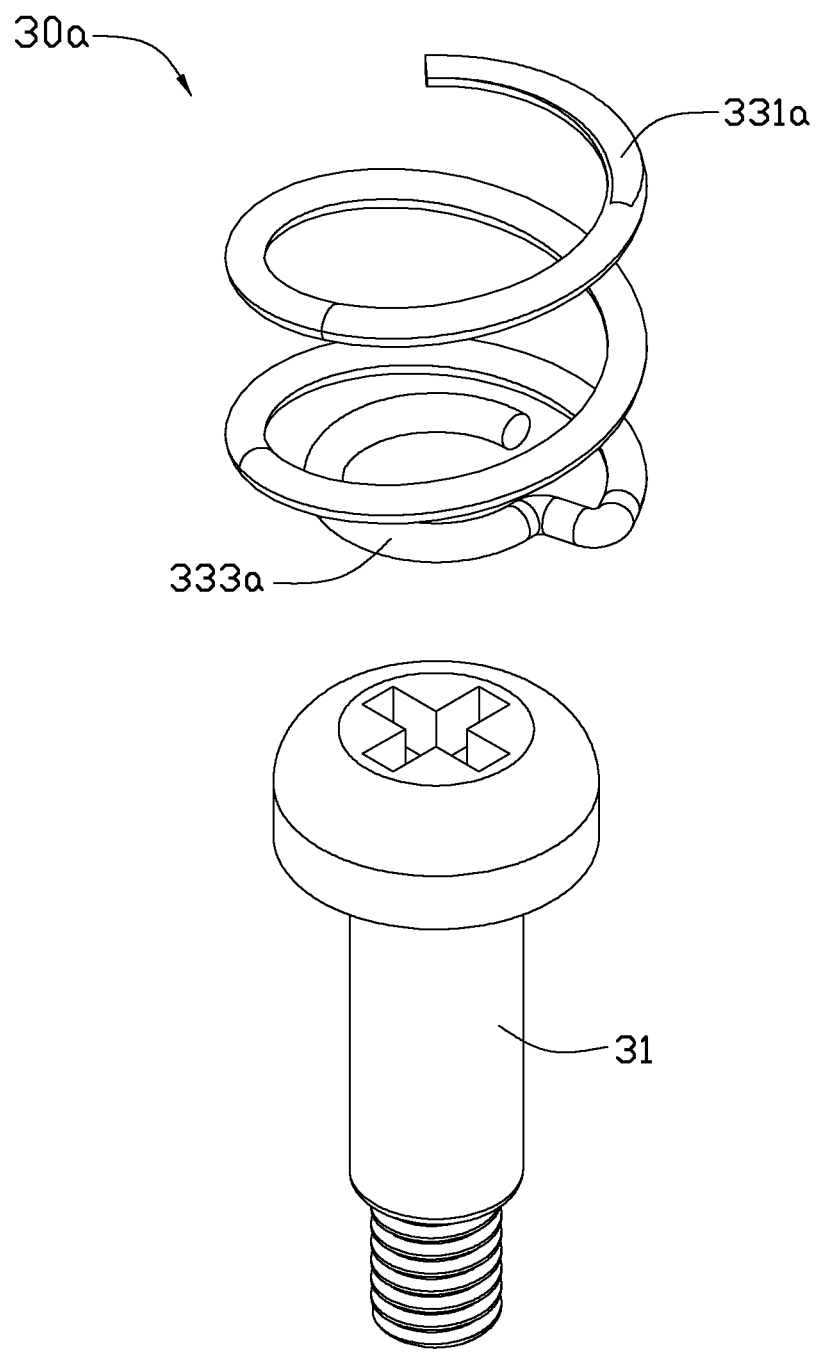
FIG. 5 is an exploded view of the fastener of FIG. 4.

Referring to FIGS. 4-5, a fastener 30a of a second embodiment is shown. The fastener 30a is similar to the fastener 30 of the first embodiment, and includes the connecting member 31 and a protecting member 33a. The protecting member 33a includes a first engaging portion 331a and a second engaging portion 333a. A difference between the fasteners 30a, 30 is that the second engaging portion 333a includes only one coil (or less than one coil), which connects with the first engaging portion 331a.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fastener comprising:
   a connecting member, the connecting member comprising a head, and a connecting portion extending down away from the head; and
   a helical spring that can be compressed along an axis thereof, the spring comprising a first engaging portion and a second engaging portion extending from the first engaging portion, the first and second engaging portions being coaxial;
   wherein the connecting portion of the connecting member extends through the second engaging portion, the head of the connecting member is surrounded by the first engaging portion of the spring with a bottom surface of the head abutting a top end of the second engaging portion, a top end of the first engaging portion is above a top surface of the head and defines a receiving space above the head, and the receiving space is adapted for receiving a tool therein.

2. The fastener of claim 1, wherein an inner diameter of each of coils of the first engaging portion is larger than an inner diameter of each of coils of the second engaging portion and larger than a diameter of the head of the connecting member, and the inner diameter of each of the coils of the second engaging portion is smaller than the diameter of the head.

3. The fastener of claim 1, wherein a recess is defined in a top surface of the head, the recess adapted to receive an end of the tool therein for manipulating the head.

4. The fastener of claim 1, wherein a number of coils of the second engaging portion is less than that of coils of the first engaging portion.

5. The fastener of claim 4, wherein the second engaging portion comprises one coil or a portion of one coil.

6. The fastener of claim 1, wherein a number of coils of the second engaging portion is more than that of coils of the first engaging portion.

7. The fastener of claim 1, wherein the connecting member further comprises a shaft, opposite ends of the shaft connect the head and the connecting portion, respectively, and the shaft is surrounded by the second engaging portion of the spring.

8. The fastener of claim 1, wherein the top end of the first engaging portion is sized to resiliently expand when the tool is received in the receiving space.

9. The fastener of claim 1, wherein a screw thread is formed on a periphery of the connecting portion.

10. The fastener of claim 1, wherein a height of the first engaging portion is less than that of the second engaging portion as measured along the longitudinal axis of the spring, and larger than a thickness of the head of the connecting member.

11. The fastener of claim 1, wherein a connection portion is formed at the top end of the second engaging portion, the connection portion extends outwardly beyond an outer surface of the head along a transverse direction perpendicular to the axis and connects with a bottom end of the first engaging portion.

12. An electronic assembly comprising:
   a printed circuit board (PCB);
   a heat-generating element mounted on the PCB;
   a heat-absorbing base thermally contacting the heat-generating element; and
   a fastener, the fastener extending through the heat-absorbing base and engaging with the PCB to mount the heat-absorbing base on the PCB, the fastener comprising:
   a connecting member, the connecting member comprising a head, and a connecting portion extending down away from the head; and
   a helical spring that can be compressed along an axis thereof, the spring comprising a first engaging portion and a second engaging portion extending from the first engaging portion, the first and second engaging portions being coaxial;
   wherein the connecting portion of the connecting member extends through the second engaging portion of the spring and the heat-absorbing base and is engaged around the PCB, the head of the connecting member is surrounded by the first engaging portion of the spring with a bottom surface of the head abutting a top end of the second engaging portion, a top end of the first engaging portion is above a top surface of the head and defines a receiving space above the head, and the receiving space is adapted for receiving a tool therein.

13. The electronic assembly of claim 12, wherein the top end of the first engaging portion is sized to resiliently expand when the tool is received in the receiving space.

14. The electronic assembly of claim 12, wherein the second engaging portion is sandwiched between the head and the heat-absorbing base.

15. The electronic assembly of claim 12, wherein a recess is defined in a top surface of the head, the recess adapted to receive an end of the tool therein for manipulating the head.

16. The electronic assembly of claim 12, wherein the connecting member further comprises a shaft, opposite ends of the shaft connect the head and the connecting portion, respectively, and the shaft is surrounded by the second engaging portion of the spring.

17. The electronic assembly of claim 12, wherein a screw thread is formed on a periphery of the connecting portion and screw holes are defined in the heat-absorbing base and the PCB, and the connecting portion engages with the screw holes.

18. The electronic assembly of claim 12, wherein a number of coils of the second engaging portion is different from that of the first engaging portion.

19. The fastener of claim 12, wherein a connection portion is formed at the top end of the second engaging portion, the connection portion extends outwardly beyond an outer surface of the head along a transverse direction perpendicular to the axis and connects with a bottom end of the first engaging portion.

20. An electrical assembly comprising:
- a printed circuit board (PCB);
- a heat generating element mounted upon the PCB;
- a heat absorbing base positioned upon the heat generating element;
- a fastener positioned upon the heat absorbing base portion and including:
- a connecting member defining a head, a connecting portion and a shaft therebetween axially, the connecting portion being secured around the PCB, the head being diametrically larger than the shaft and the connecting portion; and
- a helical protecting member defining unitarily a first engaging portion and second engaging portion below the first engaging portion, the first engaging portion being diametrically larger than the second engaging portion; wherein the second engaging portion surrounds the shaft in a compressed manner between the head and the heat absorbing base, and the first engaging portion receiving therein the head in a relaxed manner, further defines a receiving space above the head for receiving a tool actuating said head.

\* \* \* \* \*